United States Patent [19]
Pasch

[11] Patent Number: 6,121,159
[45] Date of Patent: Sep. 19, 2000

[54] POLYMERIC DIELECTRIC LAYERS HAVING LOW DIELECTRIC CONSTANTS AND IMPROVED ADHESION TO METAL LINES

[75] Inventor: Nicholas F. Pasch, Pacifica, Calif.

[73] Assignee: LSI Logic Corporation, Milpitas, Calif.

[21] Appl. No.: 08/879,100

[22] Filed: Jun. 19, 1997

[51] Int. Cl.[7] .......................... H01L 21/31; H01L 21/469
[52] U.S. Cl. ..................... 438/780; 438/680; 438/761
[58] Field of Search ...................... 438/758, 761, 438/763, 780, 680, 782

[56] References Cited

U.S. PATENT DOCUMENTS

| | | | |
|---|---|---|---|
| 5,246,782 | 9/1993 | Kennedy et al. | 428/421 |
| 5,344,981 | 9/1994 | Hendricks | 564/328 |
| 5,409,777 | 4/1995 | Kennedy et al. | 428/411.1 |
| 5,583,078 | 12/1996 | Osenbach | 438/763 |
| 5,654,237 | 8/1997 | Suguro et al. | 438/624 |
| 5,660,892 | 8/1997 | Robbins et al. | 427/537 |
| 5,674,783 | 10/1997 | Jang et al. | 437/195 |
| 5,730,922 | 3/1998 | Babb et al. | 264/258 |
| 5,742,119 | 4/1998 | Aben et al. | 313/479 |
| 5,756,207 | 5/1998 | Clough et al. | 428/375 |
| 5,858,869 | 1/1999 | Chen et al. | 438/597 |
| 5,872,064 | 2/1999 | Huff et al. | 438/778 |
| 5,877,080 | 3/1999 | Aoi et al. | 438/622 |
| 5,946,592 | 8/1999 | Lin | 438/633 |

FOREIGN PATENT DOCUMENTS

0186481 A2  7/1986  European Pat. Off. .

OTHER PUBLICATIONS

"Microprocessors Crossed Lines," Mar. 29, 1997, *The Economist*, pp. 88–89.

*Primary Examiner*—Matthew Smith
*Assistant Examiner*—Robert Hallinger
*Attorney, Agent, or Firm*—Beyer Weaver & Thomas, LLP

[57] ABSTRACT

A thermally stable inter-metal dielectric for interlayer dielectric material has enhanced adhesiveness by introduction of an adhesive material. The adhesive material may reside only at the interface of the inter-metal dielectric or interlayer dielectric with adjacent metalization and polysilicon layers. A disclosed thermally stable intermetal dielectric is a fluorinated polymer such as polyfluoropyreline. A disclosed adhesive material is a highly polar material such as a thiofluorocarbon. These materials may be deposited by chemical vapor deposition by first activating fluoropyreline monomer and di(thiodifluoromethane) in a heated activation chamber to convert them to a form suitably reactive to form a polymeric dielectric on a wafer surface.

9 Claims, 10 Drawing Sheets

POLYMERIC DIELECTRIC LAYERS HAVING LOW DIELECTRIC CONSTANTS AND IMPROVED ADHESION TO METAL LINES

BACKGROUND OF THE INVENTION

As device density continues to increase in integrated circuits, line widths and line separation distances must become smaller. As a result, detrimental capacitive effects may be experienced in metal lines connecting transistors on a substrate. The capacitive effects can result in two ways. First, two adjacent metal lines on a single metalization layer may be sufficiently close that they, together with the dielectric separating them, act as a capacitor. Second, metal lines on two adjacent metalization layers that are lined substantially on a common vertical axis can, together with the dielectric separating them, act as a capacitor. In either case, when a change in potential is applied to a line with the goal of conducting current across that line, the applied change in voltage is resisted by the presence of adjacent metal lines which act as plates of a capacitor. Further, signals on adjacent lines may interfere with one another resulting in "crosstalk."

These phenomena can be understood with reference to FIG. 1. As shown, a typical integrated circuit cross-section 8 includes a semiconductor substrate 10 on which polysilicon gates 12 and field oxide 14 are formed. An interlayer dielectric 16 (or "ILD") entirely covers the field oxide, the gate electrodes, and the substrate. Commonly, the interlayer dielectric 16 is made from a phosphosilicate glass. A first metalization layer 18 is provided on top of ILD 16 and patterned to form metal lines as shown. Note that vias (openings) are formed through ILD 16 and include metal contacts 27 connecting polysilicon gate electrodes 12 to the metal lines of metalization layer 18.

After layer 18 has been patterned, an intermetal dielectric 20 (or "IMD") is formed on top of metalization lines 18 and insulates those lines from a second metalization layer 22 which is also patterned to form separate metal lines. Interconnects 28 through IMD 20 connect the lines of first metalization layer 18 to the lines of second metalization layer 22. To insulate the conductive lines of the second metalization layer, a second intermetal dielectric layer 26 is formed on top of second metalization layer 22.

As shown with reference to first metalization layer 18 and second metalization layer 22, the individual metal lines of that metal layer may be disposed relatively close to one another. In one typical process, the height of the metal lines is about 0.7 micrometers and the width of such metal lines is about 0.4 micrometers. In addition, the individual lines may be separated by as little as 0.4 micrometers. When this is the case, the capacitive coupling between adjacent lines becomes quite pronounced.

In a technology having the line dimensions and separations indicated above, transistor switching speed may become limited by the metal lines. In this example, transistors connected by lines of greater than about 300 micrometers in length will begin to have their switching speed limited by the metal lines. For shorter line lengths, the switching speed is limited by the individual transistors. For longer line lengths, the switching speed is definitely limited by the capacitive effects experienced in the lines.

In many designs at least some of the transistors are separated by lines of at least 300 micrometers in length. Therefore, the capacitive coupling between adjacent lines represents a source of performance degradation. With this in mind, IC designers have investigated various approaches to reducing the capacitive coupling between adjacent lines and metalization layers. Of particular interest are those efforts which have strived to reduce the dielectric constant of the insulator material provided between adjacent metalization layers. A material's dielectric constant is a measure of its ability to store electrical energy. The lower its dielectric constant, the less the material can behave as if it were a capacitor. And the less charge that it stores, the less any signals passing along adjacent conductive lines will be garbled or delayed by electrical interference.

One approach to reducing dielectric constant has involved the introduction of fluorine or fluoride species into silicon dioxide IMDs. This approach has been found largely unsatisfactory because free fluorine radicals and/or ions generated during the IMD deposition process can be particularly chemically aggressive and therefore hard to control. Other approaches to reducing the dielectric constant have involved replacing the silicon dioxide conventionally employed in IMDs with an organic polymeric material. These materials may have dielectric constants as low as about 2.0; silicon dioxide based materials in conventional IMDs have dielectric constants of about 3.9. Unfortunately, it can be quite difficult to find polymeric materials which have a thermal stability adequate to withstand high temperature deposition and annealing process steps.

Commonly, during metal deposition steps, the wafer under process is exposed to temperatures of over 350° centigrade. Thus, alternative IMD materials must be able to withstand temperatures in the neighborhood of at least 350–450° centigrade. Unfortunately, suitable polymers rarely can withstand such temperatures. If the polymers are cross-linked, they typically decompose at temperatures above 350° centigrade. A material that loses more than 0.1% of its mass on exposure to a 450° centigrade environment for 1 hour is unsuitable as an IMD dielectric. The lost polymer forms volatile materials which interfere with other process steps and create unacceptably high concentrations of dangling bonds. Thermoplastic polymers (which are not cross-linked) may also decompose at high temperatures. In addition, they may liquefy and simply flow off of the wafer. Obviously, such materials are unsuitable for use in integrated circuit fabrication.

Despite these problems, ongoing research efforts have identified certain thermally stable polymers which show substantial promise as low dielectric constant IMD materials. Often, such materials are at least slightly cross-linked and/or have a fairly rigid polymer backbone. For example, these materials may include ring structures such as phenyl groups or cyclic imide groups. Of particular note, many of the most promising polymeric IMD materials are fluorinated polymers. Thus, some promising materials include polycyclic backbones having substantial fluorine substitution. One material receiving much attention is polyfluoropyreline. This material is sufficiently stable at 450° centigrade that it may be employed in conventional integrated circuit fabrication processes.

Unfortunately, it has been observed that polyfluoropyreline and related thermally stable fluorinated polymers do not adhere well to adjacent metalization lines. This is not surprising as fluorinated polymers are widely known to have very poor adhesive properties due to their low surface energies. Obviously, until these adhesion problems are overcome, thermally stable fluorinated polymers will not realize their potential as commercially viable IMD materials.

SUMMARY OF THE INVENTION

The present invention provides thermally stable polymeric IMDs and ILDs having enhanced adhesiveness by introduction of an adhesive material in the IMD or ILD polymeric material. In the preferred embodiments, the adhesive material resides only at the interface of the IMD or ILD with adjacent metalization or polysilicon layers.

One aspect of the invention generally provides an electronic circuit having a dielectric material for electrically isolating one or more conductive pathways. Specifically, the dielectric material includes a thermally stable polymeric material having its adhesiveness to the one or more conductive pathways improved by a polar material disposed on at least an interface between the polymeric material and the one or more conductive pathways. When the electronic circuit is an integrated circuit, at least three options for using the invention are available: (a) the dielectric material is an intermetal dielectric and the conductive pathways are metal lines of a metalization layer, (b) the dielectric material is an interlayer dielectric and the conductive pathways include polysilicon gate structures, and (c) the dielectric material is a packaging material and the conductive pathways include a top layer of metalization on the integrated circuit.

The thermally stable polymeric material may be evidenced by a glass transition temperature of at least about 300° centigrade. Alternatively or in addition, the thermal stability may be evidenced by the polymeric material retaining at least about 99.5% of its mass when heated to 450° centigrade for one hour. Many thermally stable polymeric materials meeting this criteria are fluorocarbon polymers. One particularly preferred fluorocarbon polymer is polyfluoropyreline.

Suitable adhesion promoting polar materials increase the polymeric material's surface energy and may include, for example, sulfur, phosphorus, nitrogen, or oxygen containing moieties. Such polar material may be integrated within the polymeric material or it may terminate at least some of the polymer chains of the thermally stable polymeric material. In a particularly preferred embodiment, the polymer is polyfluoropyreline and the polar material is thiodifluoromethane integrated with the polyfluoropyreline at a chain terminus.

Preferably, the polar material is localized at the interface between the polymeric material and the one or more conductive pathways. Alternatively, it may be disposed throughout the thermally stable polymeric material.

Another aspect of the invention provides a method of forming a dielectric material for electrically isolating one or more conductive pathways of an electronic circuit. Such method may be characterized as including the following: (a) providing the one or more conductive pathways to a chemical vapor deposition reaction chamber; (b) introducing a polar material precursor into the chemical vapor deposition reaction chamber such that a polar material adheres to the one or more conductive pathways; and (c) introducing a bulk dielectric material monomer into the chemical vapor deposition reaction chamber such that a thermally stable polymeric material deposits on the polar material and forms the dielectric material.

Often, some bulk dielectric material monomer will be introduced with the polar material precursor in (b). In addition, some of the polar material precursor may be introduced with the bulk material dielectric material monomer in (c). In a preferred embodiment, the polar material precursor is di(thiodifluoromethane) and the bulk dielectric material monomer is fluoropyreline.

The di(thiodifluoromethane) may be activated to form thiodifluoromethane (and thereby increase its reactivity) prior to introduction to the chemical vapor deposition reaction chamber in (b). One way to activate the di(thiodifluoromethane) involves heating it in an activation chamber located upstream of the chemical vapor deposition chamber. The fluoropyreline may also be activated in this manner prior to introduction to the chemical vapor deposition reaction chamber in (c).

Spin coating may be employed as an alternative to the chemical vapor deposition process. In this case, the polymer (with polar material) is dissolved in a solvent and provided to a spin coating apparatus. The dielectric layer is then formed as in a conventional spin coating process. In some cases, monomers or other precursors to the dielectric material may be reacted in the solvent—possibly during the spin coating process—to form the desired polymeric dielectric.

These and other features of the present invention will be described in more detail below in the detailed description of the invention and in conjunction with the following figures.

DETAILED DESCRIPTION OF THE PREFERRED EMBODIMENTS

Figure 1:
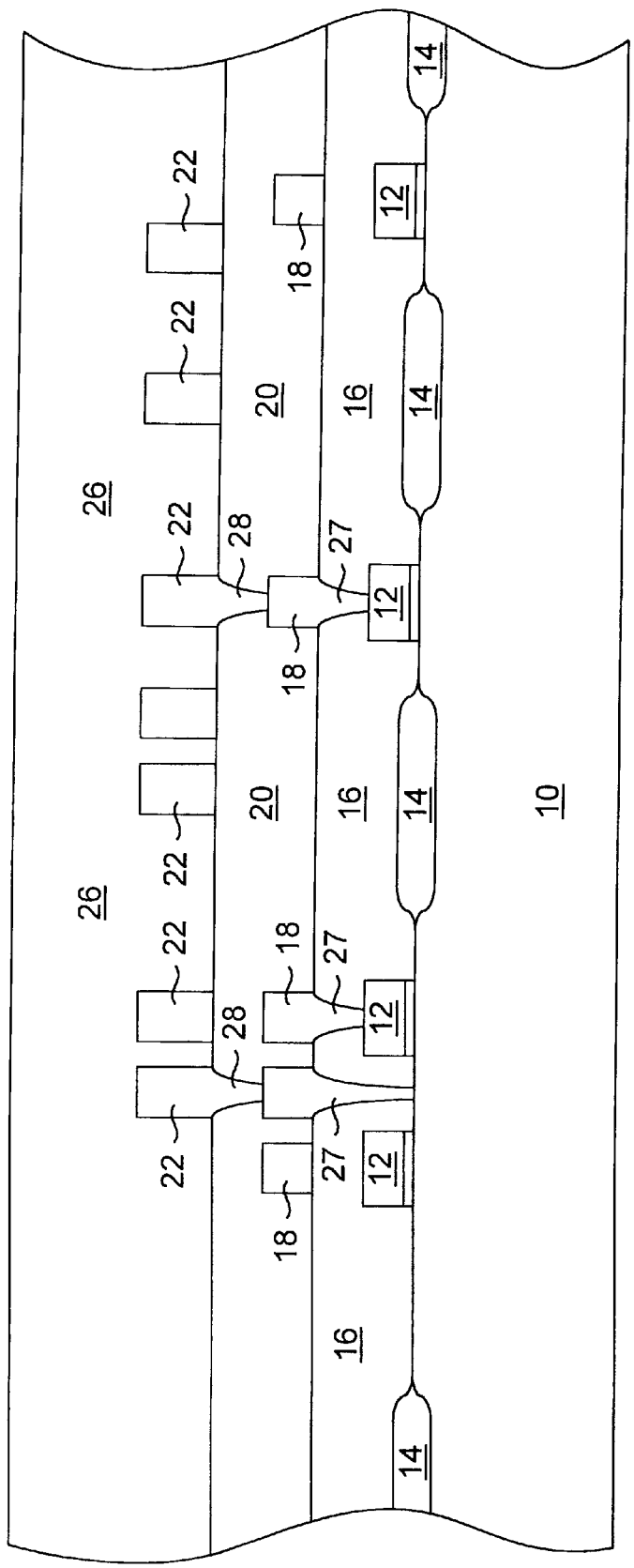
FIG. 1 is a cross-sectional view of a conventional multilevel CMOS integrated circuit having closely spaced metalization lines leading to capacitive losses during signal transmission.

As used herein, the phrase "thermally stable" refers to materials that can withstand the processing of the type typically encountered in integrated circuit fabrication processes. Usually, this will mean that the materials must be able to withstand temperatures of at least about 350° centigrade, and more preferably about 450° centigrade. In one specific measure of thermal stability, the material must be able to withstand processing at least 450° centigrade for at least 1 hour. During this time, the material must not have its viscosity reduced to a point where it flows or be decomposed to a point where it loses more than 0.5% of its initial mass. Very often, suitable polymeric materials will have a glass transition temperature ($T_g$) of at least about 300° centigrade. More preferably, the materials will have a glass transition temperature of at least about 350° centigrade.

In accordance with this invention, the polymeric IMD material should include a thermally stable polymer as defined above which has its adhesive properties improved by the addition of a material that imparts polarity to the bulk material. While the invention is not limited to specific polymers identified herein, the bulk material preferably is a fluorinated and somewhat rigid polymer. Non-fluorinated polymers that may have their adhesiveness improved in accordance with this invention include, for example, polyimides and pyrilenes. Preferably, though not necessarily, such polymer includes one or more of the following: (a) some degree of cross-linking, (b) some degree of unsaturation in the backbone, and (c) a ring structure in the backbone. One specific polymer is polyfluoropyreline.

Preferably, the polymeric IMD material has a dielectric constant of at most about 3.5. More preferably, it has a dielectric constant of between about 2.0 and 3.5. And most preferably, it has a dielectric constant of between about 2.0 and 2.8.

The material added to impart polarizability will improve the adhesion of the bulk polymeric material to the metal lines of the integrated circuit. It does so by providing a polar group that can attach to or be attracted to the metal lines or adjacent dielectric layer. It may be covalently bound to the metal lines (or polysilicon or monocrystalline silicon structures), or merely attracted to them by virtue of hydrogen bonding, electrostatic attraction, etc. Examples of suitable polarizable compounds include organosulfur compounds, organophosphorus compounds, organonitrogen compounds, organooxygen compounds, etc. Such compounds should be compatible with the bulk polymer and yet provide a polarizable group or element which improves adhesion to the metal lines. Examples of the polarizable group include thio groups, sulfate groups, sulfonate groups, sulfite groups, mercaptan groups, phosphide groups, phosphonate groups, phosphate groups, nitride groups, amine groups, nitro groups, and hydroxyl groups. Examples of suitable materials include thiodifluoromethane, difluoroethyl sulfide, fluoroethyl mercaptan, and phosphoryl chloride. A particularly preferred compound is thiodifluoromethane which spontaneously forms a dimer di(thiodifluoromethane).

If di(thiodifluoromethane) or other sulfur bearing species is employed as the adhesion promoting material, then the sulfur atom may itself link with the metal to form a metal sulfide bond. Of course, the invention need not operate this way, and may rely on a looser affinity of the sulfur species for the metal.

The adhesion promoting material may be chemically or physically integrated into the polymer matrix in various ways. For example, it may be covalently incorporated into the polymer chains. It can do this either at the terminii of the chains or in the chain interior. As explained below, it will often be desirable to have the adhesion promoting material linked to the ends of the polymer chains. While it is not necessary that the adhesion promoting material be covalently integrated with the polymer, it should at least be compatible with that polymer. Thus, it should not attack or otherwise promote degradation of the polymer matrix.

While polar materials such as thiodifluoromethane improve adhesion, they terminate polymer chains (thereby decreasing thermal stability) and they may increase the local dielectric constant. Therefore, it will be preferable to provide only very limited amounts of the polarizable groups and provide them only at the interface of the IMD or ILD material with the silicon or metalization lines. Such structures may be provided by carefully controlling introduction of polarizable compounds or their precursors during the IMD fabrication process. As explained in more detail below, chemical vapor deposition processes are particularly well adapted for controlled introduction of such polarizable materials at only the interfaces of the IMD materials.

FIGS. 2A–2G illustrate a preferred process for forming ILD and IMD polymeric layers having enhanced adhesiveness. In this example, it is assumed that the circuit under fabrication is a CMOS circuit and the ILD and IMD layers are formed by chemical vapor deposition ("CVD"). It should be understood, however, that the invention is not limited to CMOS architecture. In fact, any integrated circuit or electronic design requiring dielectric layers insulating and separating metalization lines may profitably employ the present invention. For example, bipolar and biCMOS technologies may employ the present invention. Further, the low dielectric constant adhesive polymer materials of the present invention may be employed in integrated circuit packaging such as in the passivation layer covering the top metalization layer and encapsulating the integrated circuit. Further, the invention may be employed in packages which themselves employ multiple layers of metalization for contact with flip chips or other specialized integrated circuits.

Figure 2A:
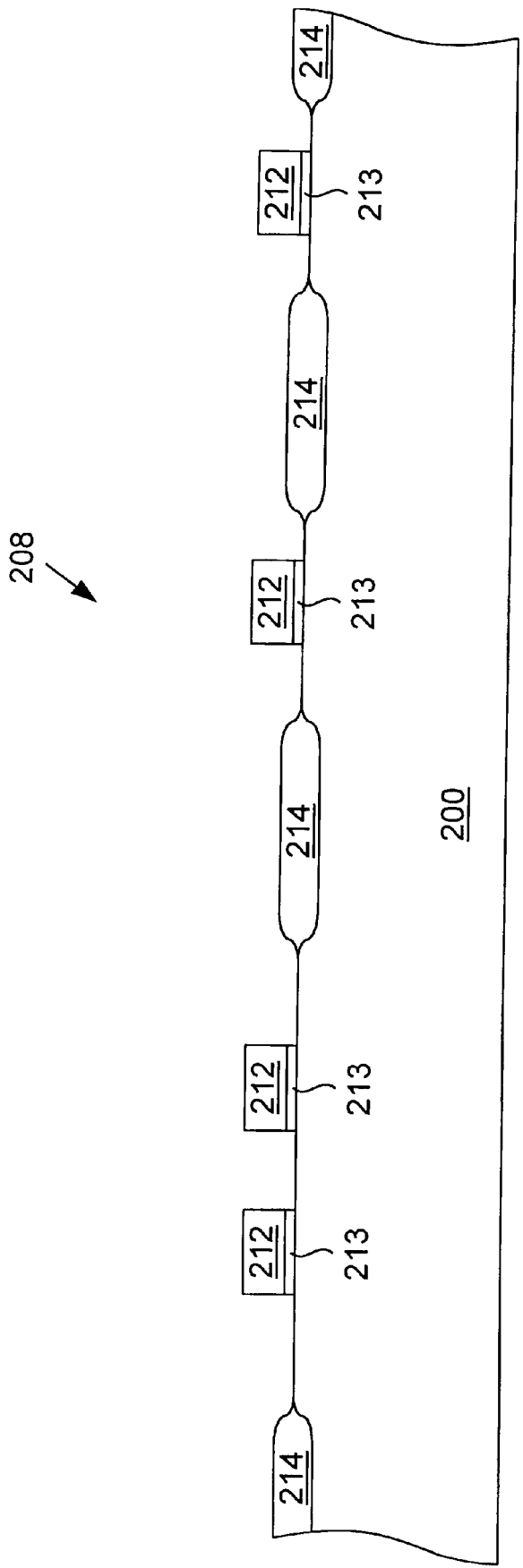
FIGS. 2A–2G are cross-sectional views of a partially fabricated CMOS integrated circuit including a polymeric dielectric material formed in accordance with this invention.

Referring now to FIG. 2A, a partially fabricated CMOS structure 208 is shown. Structure 208 includes a monocrystalline silicon substrate 200 on which are formed field oxide regions 214 for electrically isolating active transistor regions from one another. Also formed on the surface of monocrystalline silicon substrate 200 are a plurality of MOS gate electrodes 212 and gate dielectric regions 213. For simplification, source and drain diffusions are not depicted in this figure. Partially fabricated CMOS integrated circuit 208 may be formed by any conventional process and may represent a cell based design, a gate array, or other front end integrated circuit layout.

Figure 2B:
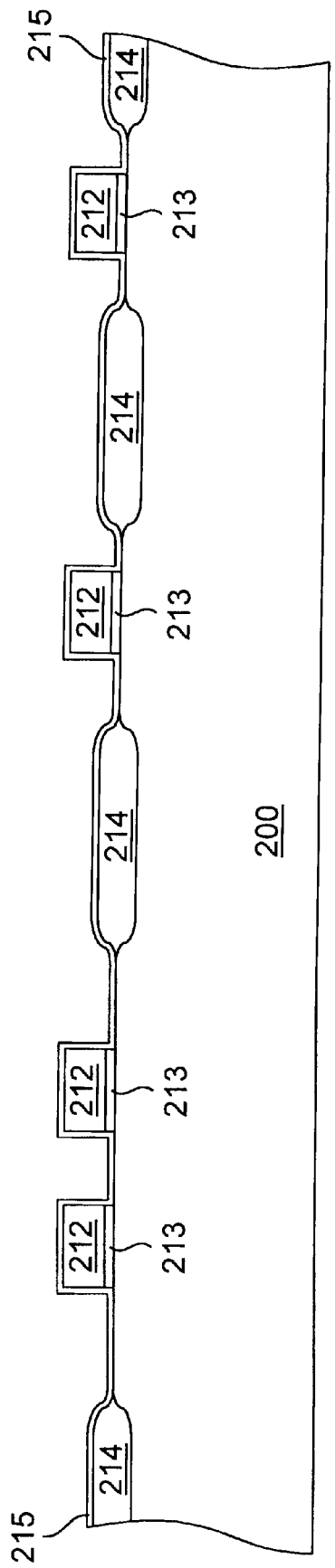

FIG. 2B shows partially fabricated integrated circuit 208 after the first part of an interlayer dielectric is formed thereon in accordance with this invention. Initially, the ILD is formed by chemical vapor deposition of a thin layer 215 of adhesive polymeric material. In a preferred embodiment, layer 215 is no thicker than about 1000 angstroms. More preferably, layer 215 is between about 50 and 500 angstroms thick. As noted above, this material will generally be highly polar in order to improve adhesiveness or a bulk fluoropolymer.

In a preferred embodiment, the chemical vapor deposition reactor includes an atmosphere of fluoropyreline monomer together with thiodifluoromethane and a carrier gas such as argon. The deposition reaction will be described in more detail below. For now, it should be understood that the fluoropyreline monomer polymerizes on the surface of partially fabricated CMOS structure 208 and integrates the thiodifluoromethane at some polymer terminii.

Figure 2C:
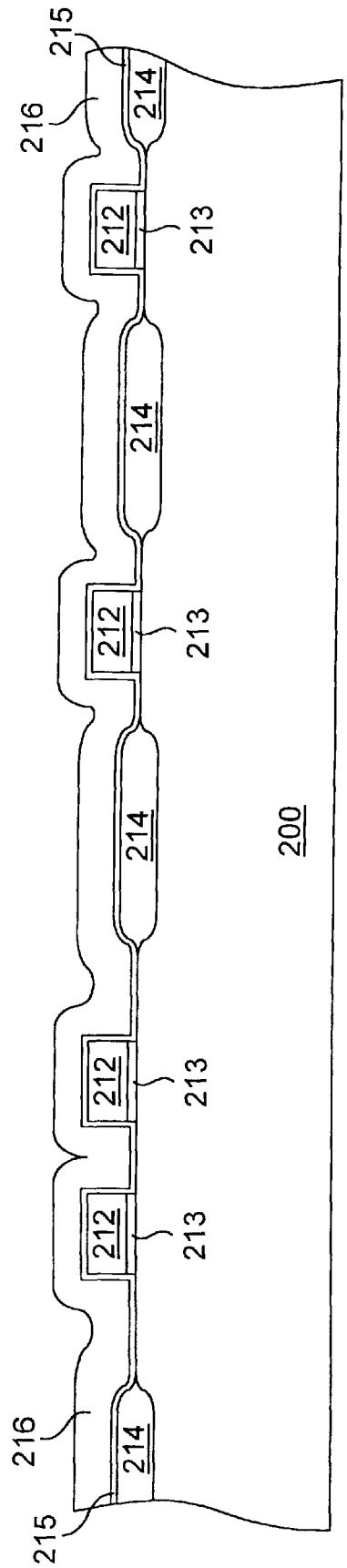

FIG. 2C depicts a device structure after a bulk ILD layer 216—substantially devoid of the adhesion promoting material concentrated in layer 215—is formed on interfacial adhesive layer 215. Layer 216 may be formed from an atmosphere of, for example, fluoropyreline monomer plus carrier gas. Note that in this example, the polar adhesion promoting material is not present in the bulk deposition process. Preferably, the ILD structure shown in FIG. 2C is formed by a continuous chemical vapor deposition process in which the atmosphere within the reactor initially contains an adhesion promoting precursor (e.g. thiodifluoromethane) together with the bulk polymer monomer (to form layer 215) and later contains only the bulk polymer monomer (to form layer 216).

Polymer layer 216 may be fabricated to include some amount of phosphorus which would serve to block diffusion of sodium ions (a well known problem in conventional glass ILD devices).

It should be understood that the polar adhesion promoting material may be incorporated throughout the ILD. In such cases, the composition that interfacial layer 215 will be the same as the composition at bulk layer 216. However, because the polarizable material may degrade the thermal stability of the ILD, it may often be desirable to deposit such material only at the interfacial regions.

After layer 216 has been deposited to an appropriate thickness (e.g., between about 3000 and 20,000 angstroms), it is planarized by a process such as polishing. The polymer layer may be deposited conformally. Therefore, it may be necessary to planarize layer 216 by a process such as chemical mechanical polishing on REB. After polishing, if necessary, a layer of adhesive polymeric material 217 is deposited on the planar top surface of bulk ILD 216. Preferably, layer 217 is deposited to a thickness of between about 50 and 500 angstroms.

Figure 2D:
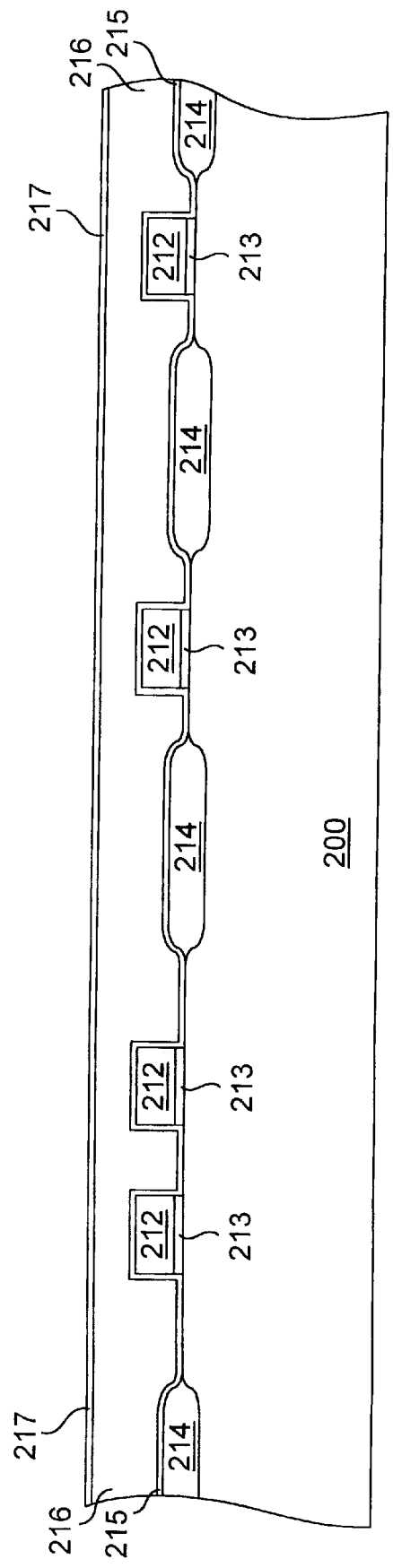

As shown in FIG. 2D, layer 217 may be formed by chemical vapor deposition from an atmosphere containing fluoropyreline monomer together with thiodifluoromethane and an appropriate carrier gas. This atmosphere may have the same or a similar composition to that employed to form first interfacial layer 215.

While bulk layer 216 is shown with two adhesion promoting layers 215 and 217 straddling it, the invention may be practiced without one or both of these layers. For example, it may be desirable include layer 217, but not layer 215. In this case, bulk layer 216 extends down to contact gate electrodes 212. Alternatively, layer 215 may be provided, but layer 217 dispensed with.

Figure 2E:
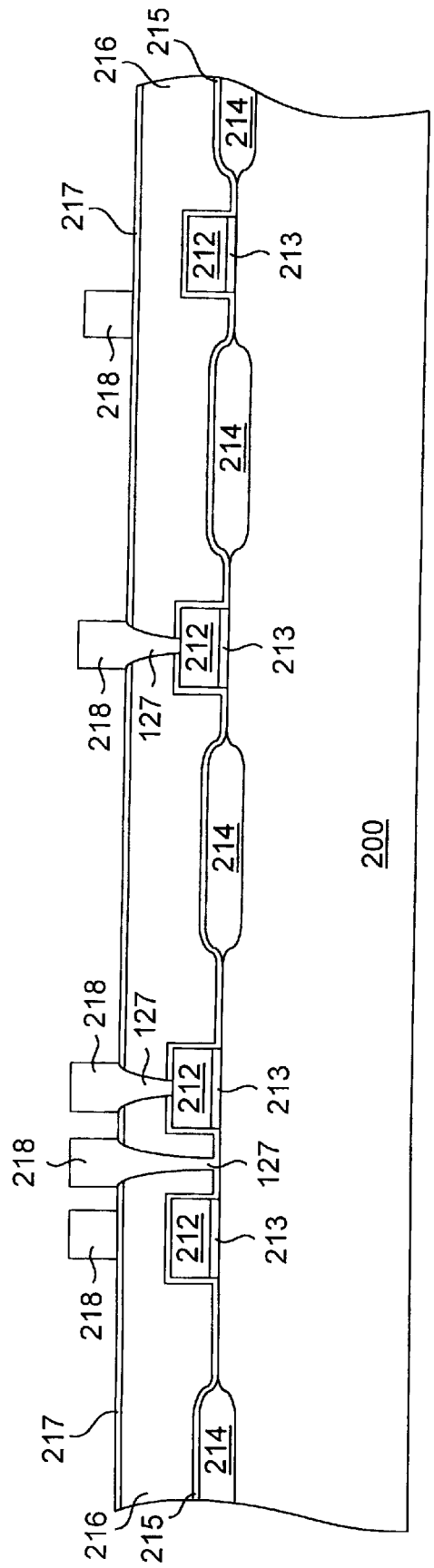

After layers 216 and 217 (if necessary) have been formed, vias are cut through the interlayer dielectric from interfacial layer 217 through bulk layer 216 and through interfacial layer 215 to underlying silicon substrate 200 or polysilicon gate 212. The vias are filled with a conductive interconnect material 127 such as tungsten. Thereafter, a first metalization layer 218 is formed on interfacial layer 217 and patterned to form individual metal lines as shown in FIG. 2E. Some of these metal lines are electrically connected to interconnects 127.

It should be understood that this invention may be practiced with a conventional interlayer dielectric such as a phosphosilicate glass or borophosphosilicate glass. In such cases, the invention is practiced only on the IMD, not the ILD.

Figure 2F:
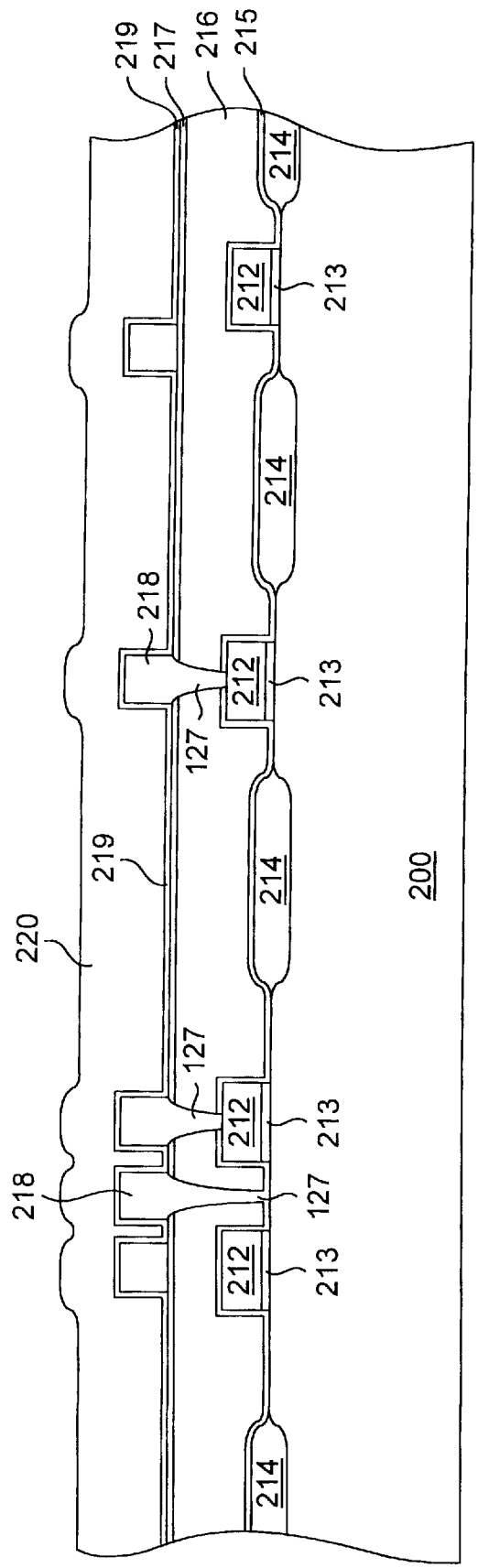

FIG. 2F depicts a structure formed after the next two process steps. These steps are employed to form at least part of the first intermetal dielectric layer. Initially, an adhesive interfacial layer 219 is formed conformally over the lines of metalization layer 218. This layer may be formed by chemical vapor deposition from an atmosphere containing fluoropyreline monomer together with thiodifluoromethane and carrier gas as described above. Thereafter, a bulk intermetal dielectric layer 220 is also formed by chemical vapor deposition from an atmosphere containing fluoropyreline monomer and an appropriate carrier gas. Note that as in the case of the ILD, the IMD may be formed without a different concentration at interfacial region 219 and bulk region 220.

Preferably, layer 219 is formed to a thickness to between about 50 and 500 angstroms. It should be understood that layer 219 may include any of a number of polarizable adhesion promoting materials as described above. For simplification of this discussion, thiodifluoromethane is used as the exemplary material. In addition, the bulk material 220 may be any thermally stable row-dielectric polymeric material. Polyfluoropyreline is simply exemplified as one preferred material.

Figure 2G:
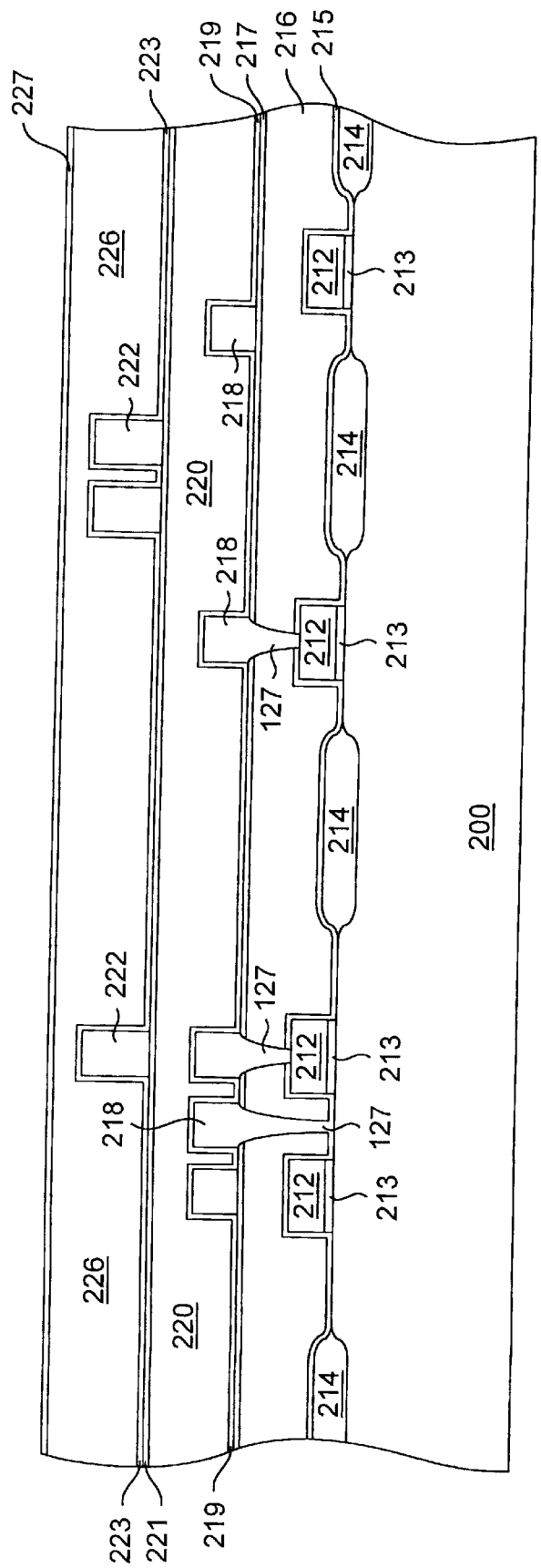

FIG. 2G depicts the completion of the first intermetal dielectric and formation of a second metalization and IMD layer. After bulk IMD material 220 is deposited to an appropriate thickness, it is planarized by a suitable process such as chemical mechanical polishing or REB. Thereafter, an interfacial adhesion-promoting layer 221 is deposited on top of planarized layer 220. This layer serves to promote adhesion to the second metalization layer which is subsequently deposited. Layer 221 may be formed by the same or similar technique as layers 219, 217 and 215. This concludes formation of the first IMD layer.

Next, vias are formed through the first IMD layer (including interfacial layers 221 and 219 as well as bulk layer 220). These vias are then filled with a conductive material such as tungsten to form interconnects (not shown). Thereafter, a second metalization layer 222 is formed on interfacial layer 221 and patterned to form individual lines as illustrated in FIG. 2G. On these lines, a thin interfacial adhesion promoting layer 223 is formed as described above. Thereafter, a bulk second IMD polymeric layer 226 is formed as described above. Specifically, this material preferably will not include the polarizable adhesion promoting material. Next, layer 226 is planarized and an interfacial adhesion promoting layer 227 is deposited on the top surface thereof. Interfacial layer 227 may be formed by a process similar to that employed to form layer 223, for example. Subsequent metalization layers and IMDs may be formed as described with respect to the first and second metalization layers and IMDs.

In both the first and second IMD layers, the adhesion promoting interfacial layers may be limited to the top or bottom of the layer. Preferably, practice of the invention includes both top and bottom interfacial layers. However, the invention includes the situation in which only of the top or bottom interfacial layers are employed.

Figure 3:
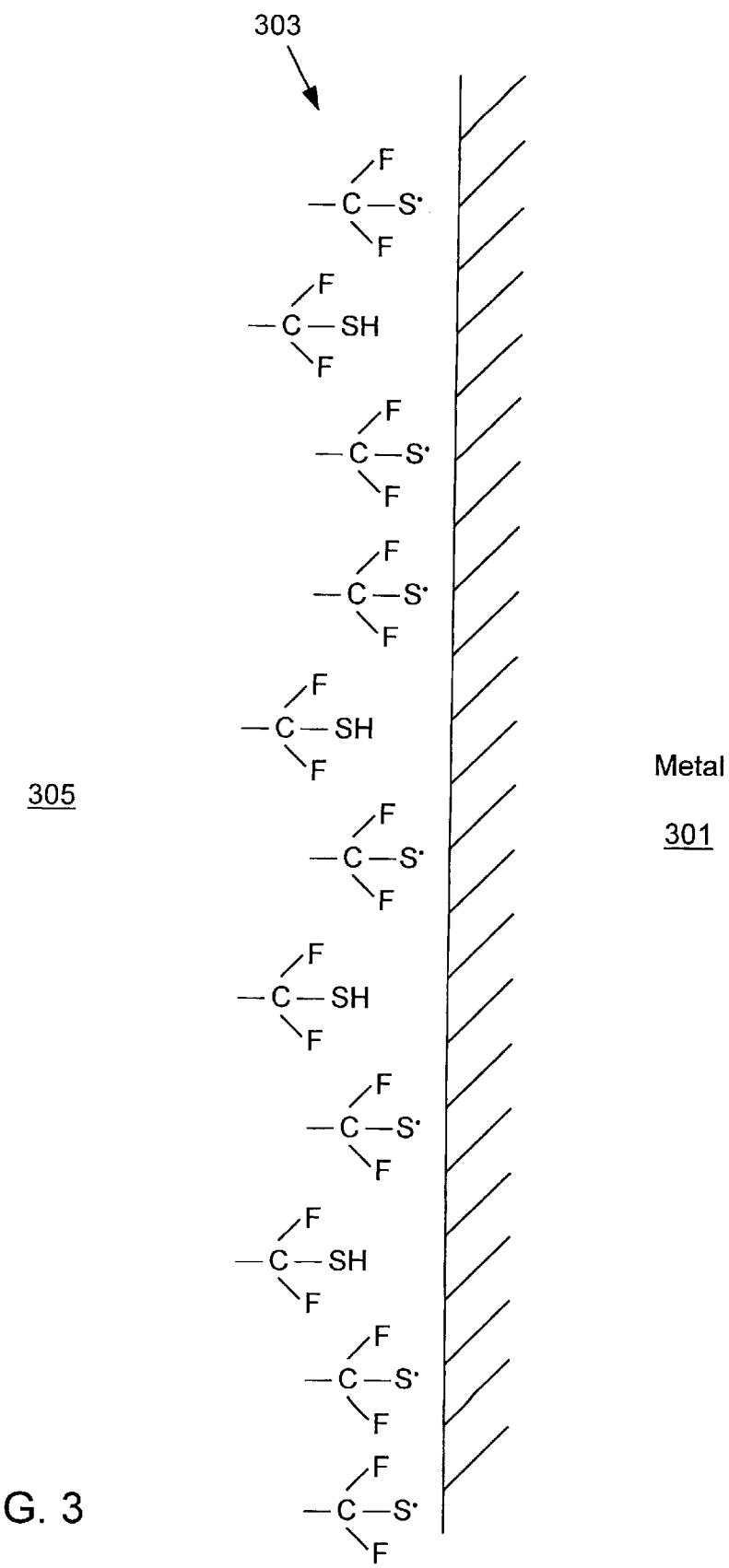
FIG. 3 is a molecular depiction of an interface between a metal line and a polymeric dielectric material in accordance with one embodiment of this invention.

FIG. 3 presents an idealized molecular representation of an interfacial adhesion promoting layer at the surface of a metal line. FIG. 3 may represent, for example, the vertical interface between one of metal lines 218 and interfacial IMD layer 219. As shown, sulfur containing chain terminii derived from thiodifluoromethane are preferentially concentrated near the interface with a metal structure 301. A region of higher concentration of thio groups 303 proximate the interface with metal structure 301 is illustrated. This locally high concentration results because the thio precursor is included in the reaction mixture early in the deposition process while the layer closest to the metalization lines is being formed. Of course, not all of the thio groups are located immediately adjacent as the metal lines. But those that are located close to the metal line help adhere the bulk dielectric layer to the metal lines.

The bulk dielectric material is provided in a region 305. Note that there are fewer thio groups in this region. As the chemical vapor deposition reaction proceeds with less polarizable material—after an initial period of high sulfur deposition—bulk region 305 begins to form. In this region, there will be little, if any, polarizable group as shown.

While FIG. 3 depicts a polyfluoropyreline and thiodifluoromethane system, other bulk polymer and polarizable group combinations may be employed as described above. For example, phosphorus-containing polarizable groups may be provided in region 303.

Figure 4:
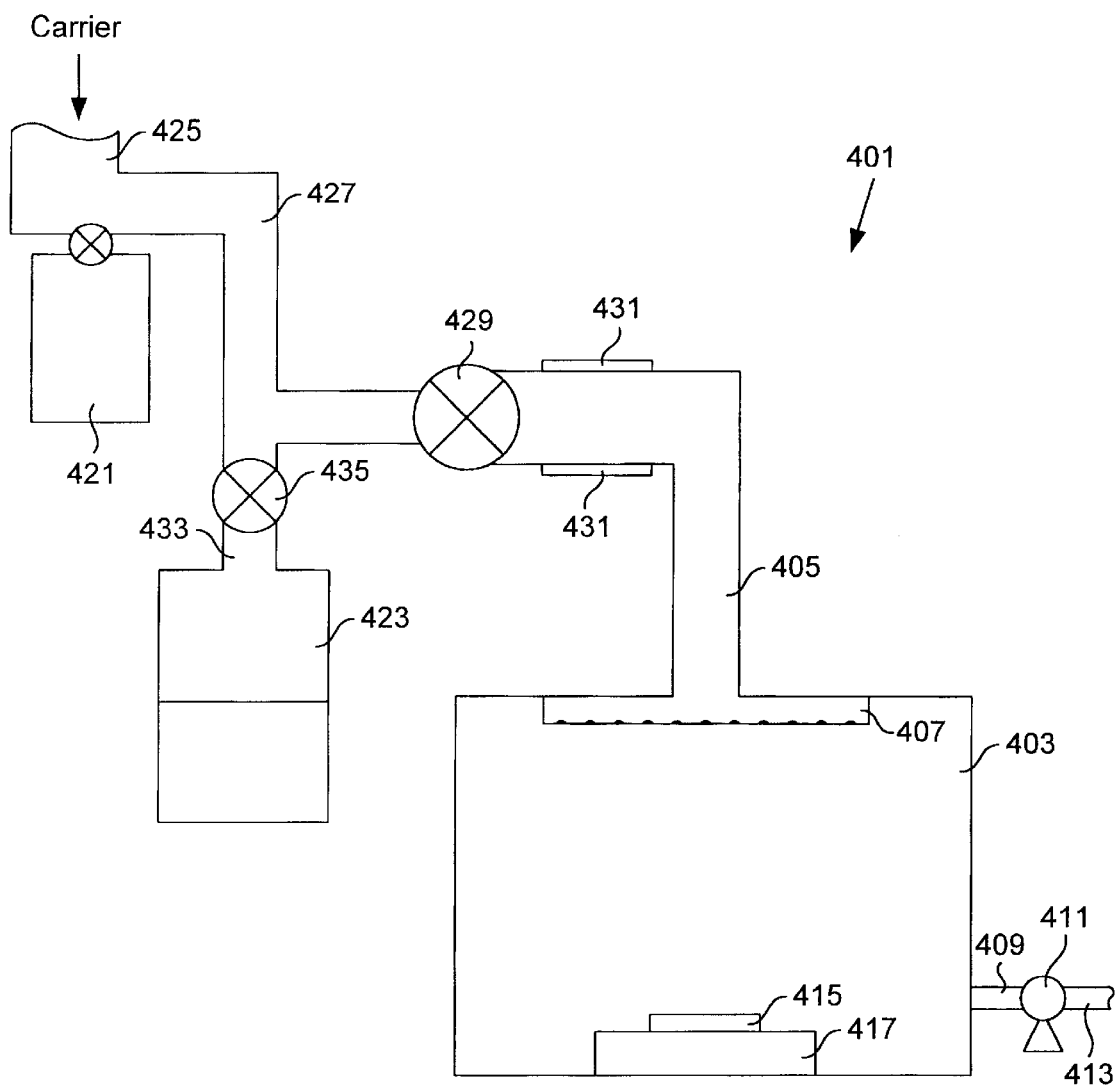
FIG. 4 is a cross-sectional view of a chemical vapor deposition reaction apparatus that may be employed to form the adhesive polymeric dielectric materials of the present invention.

FIG. 4 is an illustration of a chemical vapor deposition reactor 401 suitable for forming ILD and IMD layers in accordance with the present invention. Reactor 401 includes a reaction chamber 403 which receives reactant gases from an inlet 405 coupled to a gas distribution nozzle 407 such as a shower head. Excess reactant gases as well as reaction products are removed from reaction chamber 403 via an outlet line 409 coupled to a pump 411 such as a turbo molecular pump. The exhaust gas pumped from pump 411 flows through an outlet line 413 and out of the system. In some embodiments, reaction chamber 403 may be outfitted with one or more electrodes for facilitating formation of a weak plasma to enhance deposition of the polymer or adhesion promoting material.

A partially fabricated integrated circuit 415 is provided within reaction chamber 403 on a support 417 which may be an electrostatic or mechanical chuck, for example. Reactant gases are provided from storage vessels 421 and 423. Vessel 421 provides the monomer for the bulk polymer of the IMD or ILD. Vessel 423 includes the polarizable material for promoting adhesion at the interface of the IMD or ILD. In FIG. 4, vessel 421 may house fluoropyreline and vessel 423 may house di(thiodifluoromethane). It should be understood that the stable form of thiodifluoromethane is the dimer di(thiodifluoromethane). Also, the stable form of fluoropyreline is a dimer.

An inert carrier gas such as nitrogen or argon is provided through a line 425 which is connected to a line from vessel 421. In the embodiment shown, fluoropyreline dimer is provided from vessel 421 and mixes with carrier gas from line 425. The resulting fluoropyreline dimer and carrier gas mixture then flows through a line 427 through a valve 429 and into an activation chamber 431. Activation chamber 431 is provided to activate the bulk dielectric monomer compounds so that they may more readily react to form the bulk polymer on substrate 415. This may be accomplished by heating the walls of chamber 431 to a temperature sufficient to increase the activity of the reactants. Activation in this example will convert the thiodifluoromethane and fluoropyreline dimers to monomers. In a preferred embodiment, chamber 431 includes an activating alloy such as Monel™ to facilitate the activation process. Other suitable linings may include quartz.

Vessel 423, as noted, houses the polarizable adhesion promoting precursor. Vessel 423 is connected to main line 427 via a line 433 including a control valve 435. When interfacial adhesion promoting layers are to be formed, valve 435 is opened and volatile polarizable precursor gas is added to the reactant mix passing through line 427 and activation chamber 431. Note that activation chamber 431 may also activate the polarizable adhesion promoting material. For example, it may convert di(thiodifluoromethane) to thiodifluoromethane. To this end, activation chamber 431 may be heated to a temperature in the range of 300–350° centigrade. When non-interfacial, bulk dielectric is being formed, valve 435 may be closed to prevent or restrict flow of the polarizable material precursor from vessel 423 to reaction chamber 403.

In an alternative embodiment, the dielectric ILD or IMD is applied by a conventional spin coating technique. Such techniques are widely used in the art for applying photoresist to wafers and other applications. A general discussion of these techniques can be found in the text "Integrated Circuit Fabrication Technology", D. Elliott, 2d Ed., McGraw-Hill (1989), Chapter 6. In the classic spin coating technique, a wafer support rotates a wafer to be coated while the coating fluid is applied the wafer surface. The centrifugal forces balanced against surface tension, and solvent evaporation distribute the fluid uniformly over the wafer surface. Ultimately, the solvent completely evaporates, leaving behind a planar layer. This process forms a low dielectric constant ILD or IMD layer of this invention.

In one embodiment, the polymeric dielectric material is provided in a solvent which partially evaporates during the spin coating process. The dielectric material has incorporated therein the polar or adhesion promoting material. For example, the fluid dispensed to the wafer may include a solvent which solvates a polyfluoropyreline having some amount of thio difluoromethane at polymer chain terminii.

In another variation, polymer precursors and adhesion promoting material precursors are provided in a solvent delivered to the spin coating apparatus. Then prior to or during spin coating, the fluid is exposed to conditions that promote polymerization. Solvent is then evaporated from the resultant polymer matrix, leaving the desired ILD or IMD.

One advantage of a liquid based process is that the initially formed polymer layer is relatively flat. That is, it forms by a non-conformal process. This means that the wafer then needs little additional processing to remain flat enough to have subsequent photolithography steps performed on its surface. Unfortunately, it is difficult to localize the polarizable adhesion promoting material to the interfaces with the metalization layers in a liquid-based process. In such processes, therefore, the polarizable material should be chosen such that it does not unduly degrade the thermal stability of the IMD or ILD.

In an alternative embodiment, the spin coated IMD or ILD is formed in multiple steps. For example, in a first step, one could spin on a thin coating of the polar adhesive material. This is then cured or partially cured to immobilize. Next, the full polymer layer could spin coated to the necessary thickness and cured.

In the liquid phase reaction, it may be desirable to include minute quantities of carbon or carbon precursor in the reactant liquid. As an electrical conductor, the carbon helps any charges building up in the insulator to seep away. This lowers its capacitance, and hence reduces the delays and interference-effects that can degrade a chip's internal signaling. The use of minute quantities of carbon to decrease capacitance has been employed by a company Plasma and Materials Technologies of Chatsworth, Calif. in an inorganic IMD structure. That process involves a mixture of methylsilane gas and hydrogen peroxide.

Although the foregoing invention has been described in some detail for purposes of clarity, it will be apparent that certain changes and modifications may be practiced within the scope of the appended claims. Therefore, the described embodiments are to be considered illustrative and not restrictive, and the invention is not to be limited to the details given herein, but may be modified within the scope of the appended claims.

What is claimed is:

1. A method of forming a dielectric material for electrically isolating one or more conductive pathways of an electronic circuit, the method comprising the following:

(a) providing said one or more conductive pathways to a chemical vapor deposition reaction chamber;

(b) introducing a polar material precursor into said chemical vapor deposition reaction chamber such that a polar material adheres to said one or more conductive pathways; and (c) introducing a bulk dielectric material monomer into the chemical vapor deposition reaction chamber such that a thermally stable polymeric material deposits on the polar material and forms the dielectric material, wherein the dielectric material is an interlayer dielectric or an intermetal dielectric included in an electronic circuit.

2. The method of claim 1, wherein at least some of the bulk dielectric material monomer is introduced with the polar material precursor in (b).

3. The method of claim 1, wherein at least some of the polar material precursor is introduced with the bulk dielectric material monomer in (c).

4. The method of claim 1, wherein the thermally stable polymeric material is a thermoplastic having a glass transition temperature of at least about 300 degrees centigrade.

5. The method of claim 1, further including heating the thermally stable polymeric material.

6. The method of claim 5, wherein the thermally stable polymeric material maintains at least about 99.5% of its initial mass when heated to 450 degrees centigrade for one hour.

7. The method of claim 1, wherein the polar material precursor includes a sulfur, phosphorus, nitrogen, or oxygen containing moiety.

8. the method of claim 1, wherein the polar material precursor terminates at least some of the polymer chains of the thermally stable polymeric material.

9. the method of claim 1, wherein the polar material is localized at the interface between the polymeric material and the one or more conductive pathways.

* * * * *